United States Patent
Park et al.

(10) Patent No.: US 11,424,316 B2
(45) Date of Patent: Aug. 23, 2022

(54) CAPACITOR STRUCTURE AND SEMICONDUCTOR DEVICE INCLUDING THE SAME

(71) Applicant: SAMSUNG ELECTRONICS CO., LTD., Suwon-si (KR)

(72) Inventors: Jungmin Park, Seoul (KR); Haeryong Kim, Seongnam-si (KR); Younsoo Kim, Yongin-si (KR); Younggeun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/916,263

(22) Filed: Jun. 30, 2020

(65) Prior Publication Data
US 2021/0183992 A1 Jun. 17, 2021

(30) Foreign Application Priority Data
Dec. 13, 2019 (KR) .................. KR10-2019-0166401

(51) Int. Cl.
*H01L 49/02* (2006.01)
*H01L 27/108* (2006.01)

(52) U.S. Cl.
CPC ........ *H01L 28/56* (2013.01); *H01L 27/10814* (2013.01); *H01L 27/10855* (2013.01); *H01L 27/10885* (2013.01); *H01L 27/10826* (2013.01)

(58) Field of Classification Search
None
See application file for complete search history.

(56) References Cited

U.S. PATENT DOCUMENTS

| 5,807,774 | A | 9/1998 | Desu et al. |
| 5,861,332 | A | 1/1999 | Yu et al. |
| 6,362,068 | B1* | 3/2002 | Summerfelt ........... H01G 4/306 |
| | | | 257/E21.01 |
| 6,403,441 | B1 | 6/2002 | Takehiro et al. |
| 6,777,248 | B1 | 8/2004 | Nabatame et al. |
| 8,202,808 | B2 | 6/2012 | Matz et al. |
| 8,399,952 | B2 | 3/2013 | Srinivasan et al. |
| 9,062,390 | B2* | 6/2015 | Blomberg ......... H01L 21/02194 |
| 10,825,889 | B2* | 11/2020 | Kang ................ H01L 27/10855 |

(Continued)

FOREIGN PATENT DOCUMENTS

| JP | 2004-23042 A | 1/2004 |
| JP | 4011226 B2 | 11/2007 |
| KR | 2002-0002722 | 1/2002 |

*Primary Examiner* — Steven M Christopher
(74) *Attorney, Agent, or Firm* — Lee IP Law, P.C.

(57) ABSTRACT

A capacitor structure and a semiconductor device, the capacitor structure including a lower electrode on a substrate; a seed layer on the lower electrode; a dielectric layer on the seed layer; and an upper electrode on the dielectric layer, wherein the dielectric layer includes a ternary metal oxide having a chemical formula of $ABO_3$, in which each of A and B is independently a metal, and the seed layer includes a ternary metal oxide containing the same elements as that of the dielectric layer, the ternary metal oxide having a chemical formula of $ABO_{3-x}$, in which each of A and B is the same metal as A and B of the ternary metal oxide having a chemical formula of $ABO_3$, $0<x<3$, and x is a real number.

10 Claims, 21 Drawing Sheets

(56) References Cited

U.S. PATENT DOCUMENTS

| | | | |
|---|---|---|---|
| 2003/0052376 A1* | 3/2003 | Lee | H01L 21/02356 |
| | | | 257/410 |
| 2008/0123243 A1 | 5/2008 | Hamada et al. | |
| 2009/0130457 A1* | 5/2009 | Kim | H01G 4/33 |
| | | | 428/432 |
| 2014/0150966 A1* | 6/2014 | Osada | B82Y 30/00 |
| | | | 156/273.3 |
| 2019/0189768 A1* | 6/2019 | Liao | H01L 28/40 |

* cited by examiner

CAPACITOR STRUCTURE AND SEMICONDUCTOR DEVICE INCLUDING THE SAME

CROSS-REFERENCE TO RELATED APPLICATION

This application claims priority under 35 U.S.C. § 119 to Korean Patent Application No. 10-2019-0166401, filed on Dec. 13, 2019, in the Korean Intellectual Property Office, and entitled: "Capacitor Structure and Semiconductor Device Including the Same," is incorporated by reference herein in its entirety.

BACKGROUND

1. Field

Embodiments relate to a capacitor structure and a semiconductor device including the same.

2. Description of the Related Art

In a manufacturing process of a dynamic random access memory (DRAM) device, a capacitor structure including a lower electrode, a dielectric layer, and an upper electrode sequentially stacked may be formed on a substrate.

SUMMARY

The embodiments may be realized by providing a capacitor structure including a lower electrode on a substrate; a seed layer on the lower electrode; a dielectric layer on the seed layer; and an upper electrode on the dielectric layer, wherein the dielectric layer includes a ternary metal oxide having a chemical formula of $ABO_3$, in which each of A and B is independently a metal, and the seed layer includes a ternary metal oxide containing the same elements as that of the dielectric layer, the ternary metal oxide having a chemical formula of $ABO_{3-x}$, in which each of A and B is the same metal as A and B of the ternary metal oxide having a chemical formula of $ABO_3$, $0<x<3$, and x is a real number.

The embodiments may be realized by providing a capacitor structure including a lower electrode on a substrate; a seed layer on the lower electrode; a dielectric layer on the seed layer; and an upper electrode on the dielectric layer, wherein the dielectric layer includes $SrTiO_3$, $BaTiO_3$, or $CaTiO_3$, the seed layer includes $SrTiO_{3-x}$, $BaTiO_{3-x}$ or $CaTiO_{3-x}$, in which $0<x<3$, and x is a real number, and the dielectric layer has a Perovskite structure.

The embodiments may be realized by providing a semiconductor device including gate structures each extending at an upper portion of a substrate in a first direction parallel to an upper surface of the substrate, the gate structures being spaced apart from each other along a second direction parallel to the upper surface of the substrate and crossing the first direction; bit line structures each extending in the second direction on the gate structures, the bit line structures being spaced apart from each other along the first direction; a contact plug structure adjacent to the bit line structure, the contact plug including a lower contact plug, a metal silicide pattern, and an upper contact plug sequentially stacked along a vertical direction perpendicular to the upper surface of the substrate; and a capacitor structure contacting an upper surface of the contact plug structure, wherein the capacitor structure includes a lower electrode, a seed layer, a dielectric film, and an upper electrode sequentially stacked, the dielectric layer includes a ternary metal oxide having a chemical formula of $ABO_3$, in which each of A and B is independently a metal, and the seed layer includes a ternary metal oxide containing the same elements as that of the dielectric layer, the ternary metal oxide having a chemical formula of $ABO_{3-x}$, in which each of A and B is the same metal as A and B of the ternary metal oxide having a chemical formula of $ABO_3$, $0<x<3$, and x is a real number.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, two directions substantially parallel to an upper surface of a substrate and substantially perpendicular to each other may be defined as first and second directions, respectively. A direction that is orthogonal to the first and second directions is defined as a vertical direction.

FIGS. 1 to 6 are cross-sectional views of stages in a method of forming a capacitor structure according to example embodiments.

Figure 1:
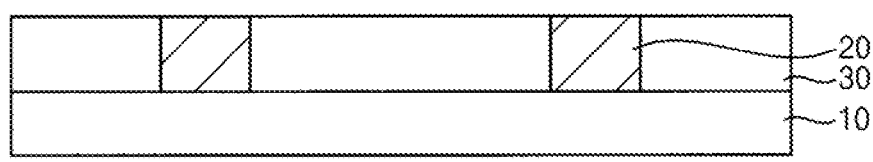
FIGS. 1 to 6 are cross-sectional views of stages in a method of forming a capacitor structure according to example embodiments.

Referring to FIG. 1, after forming a contact plug 20 on a substrate 10, a first insulating interlayer 30 may be formed on the substrate 10 to surround a sidewall of the contact plug 20.

The substrate 10 may include silicon, germanium, silicon-germanium, or a III-V group compound semiconductor, e.g., GaP, GaAs, or GaSb. In an implementation, the substrate 10 may be a silicon-on-insulator (SOI) wafer or a germanium-on-insulator (GOI) wafer.

Various types of elements, e.g., an active pattern, a gate structure, a bit line structure, a source/drain layer, etc., may be formed on the substrate 10. The elements may be covered by the first insulating interlayer 30, and the contact plug 20 may be electrically connected to the source/drain layer. The first insulating interlayer 30 may include, e.g., an oxide such as silicon oxide.

In an implementation, the contact plug 20 may be formed by sequentially forming a contact plug layer and an etching mask partially covering the contact plug layer on the substrate 10, and performing an etching process on the contact plug layer using the etching mask. The first insulating interlayer 30 may be formed on the substrate 10 to cover a sidewall of the contact plug 20.

In an implementation, the contact plug 20 may be formed by forming the first insulating interlayer 30 having a hole exposing the substrate 10, forming the contact plug layer filling the recess to a sufficient height, and planarizing an upper portion of the contact plug layer until an upper surface (e.g., surface facing away from the substrate 10 in the vertical direction) of the first insulating interlayer 30 is exposed.

In an implementation, a plurality of contact plugs 20 may be spaced apart from each other in each of the first direction and the second direction.

Figure 2:
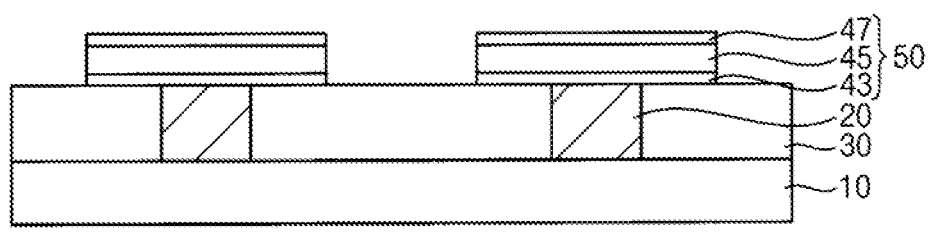

Referring to FIG. 2, a preliminary lower electrode structure 50 may be formed to contact the upper surface of the contact plug 20.

The preliminary lower electrode structure 50 may be formed by sequentially stacking a first oxide layer, a preliminary lower electrode layer, and a second oxide layer (e.g., in the vertical direction) on the contact plug 20 and the first insulating interlayer 30, and patterning the first oxide layer, the preliminary lower electrode layer, and the second oxide layer. In an implementation, the first oxide layer, the preliminary lower electrode layer, and the second oxide layer may be patterned into a first oxide pattern 43, a preliminary lower electrode 45, and a second oxide pattern 47, respectively, which may form the preliminary lower electrode structure 50.

Each of the first oxide layer, the preliminary lower electrode layer, and the second oxide layer sequentially stacked may be formed by, e.g., a chemical vapor deposition (CVD) process, an atomic layer deposition (ALD) process, or a physical vapor deposition (PVD) process.

In an implementation, as illustrated in the drawing, the preliminary lower electrode structure 50 may cover the upper surface of the contact plug 20 and a portion of the upper surface of the first insulating interlayer 30. In an implementation, the preliminary lower electrode structure 50 may be formed to cover only the upper surface of the contact plug 20.

The first and second oxide patterns 43 and 47 may include the same material, and the preliminary lower electrode 45 may include a material different therefrom. Each of the first and second oxide patterns 43 and 47 may include, e.g., an oxide such as strontium oxide (SrO), and the preliminary lower electrode 45 may include, e.g., a metal such as ruthenium (Ru), molybdenum (Mo), cobalt (Co), iridium (Ir), or the like. In an implementation, each of the first and second oxide patterns 43 and 47 may include an oxide such as barium oxide (BaO) or calcium oxide (CaO).

In an implementation, the first oxide pattern 43, the preliminary lower electrode 45, and the second oxide pattern 47 may be formed to have the same thickness (e.g., as measured in the vertical direction). In an implementation, the first and second oxide patterns 43 and 47 may be formed to have the same thickness as each other, and the first and second oxide patterns 43 and 47 may be formed to have a smaller thickness than that of the preliminary lower electrode 45 (e.g., as measured in the vertical direction).

Figure 3:
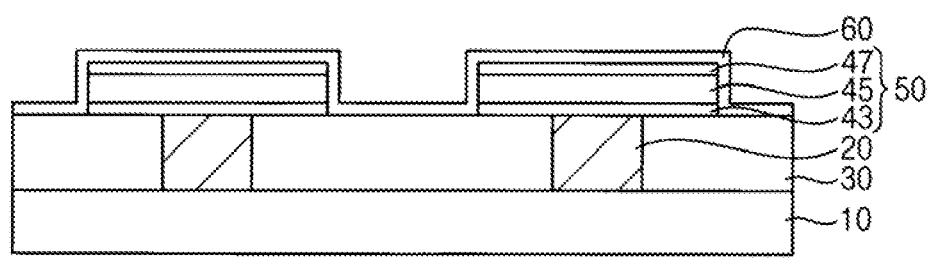

Referring to FIG. 3, a capping layer 60 may be conformally formed to cover the upper surface of the first insulating interlayer 30 and an upper surface and a sidewall of the preliminary lower electrode structure 50.

The capping layer 60 may include, e.g., an oxide such as titanium oxide ($TiO_2$).

Figure 4:
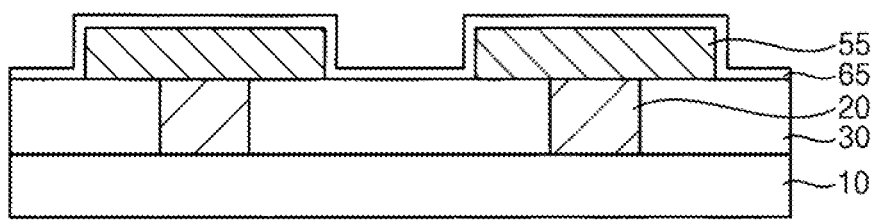

Referring to FIG. 4, an annealing process may be performed on the capping layer 60 to form a lower electrode 55 and a seed layer 65 sequentially stacked.

In an implementation, when the annealing process is performed, the first and second oxide patterns 43 and 47 may provide oxygen (O) to the preliminary lower electrode 45, and the preliminary lower electrode 45 may provide ruthenium (Ru), molybdenum (Mo), cobalt (Co), or iridium (Ir) to the first and second oxide patterns 43 and 47. The first oxide pattern 43, the preliminary lower electrode 45, and the second oxide pattern 47 may react to form the lower electrode 55 including a ternary metal oxide throughout. The first oxide pattern 43, the preliminary lower electrode 45, and the second oxide pattern 47 may react to form the lower electrode 55 as a result of the annealing process.

In an implementation, the lower electrode 55 may include a ternary metal oxide having a chemical formula of $ABO_3$ (in which each of A and B is independently a metal). In an implementation, the ternary metal oxide may include a first element A (e.g., a first metal element), a second element B (e.g., a second metal element that is different from the first metal element), and a third element (e.g., oxygen). In an implementation, the ternary metal oxide may have a Perovskite structure. In an implementation, the ternary metal oxide may include, e.g., strontium ruthenate ($SrRuO_3$), strontium molybdate ($SrMoO_3$), strontium cobaltate ($SrCoO_3$), strontium iridate ($SrIrO_3$), barium ruthenate ($BaRuO_3$), barium molybdate ($BaMoO_3$), barium cobaltate ($BaCoO_3$), barium iridate ($BaIrO_3$), calcium ruthenate ($CaRuO_3$), calcium molybdate ($CaMoO_3$), calcium cobaltate ($CaCoO_3$), or calcium iridate ($CaIrO_3$).

In an implementation, a concentration of oxygen at a central portion of the lower electrode 55 may be greater than a concentration of oxygen at an upper portion thereof (e.g., a portion of the lower electrode 55 distal to the substrate 10 in the vertical direction) or a concentration of oxygen at a lower portion thereof (e.g., a portion of the lower electrode 55 proximate to the substrate 10 in the vertical direction). In an implementation, the concentration of oxygen at the upper portion of the lower electrode 55 may be greater than the concentration of oxygen at the lower portion of the lower electrode 55.

In an implementation, as illustrated in the drawing, the lower electrode 55 may have a pillar-shape. In an implementation, a cylindrical-shaped lower electrode 55 may be formed.

The first and second oxide patterns 43 and 47 may provide strontium (Sr), barium (Ba), or calcium (Ca) to the capping layer 60, and thus the capping layer 60 may react to form a seed layer 65 including another ternary metal oxide (e.g., during the annealing process). When the annealing process is performed, the oxygen (O) component included in the capping layer 60 may diffuse into the first and second oxide patterns 43 and 47, and the seed layer 65 may have an oxygen concentration less than that of a ternary metal oxide having a chemical formula of $ABO_3$ forming a perovskite structure.

In an implementation, the seed layer 65 may include a material having an oxygen concentration less than that of the ternary metal oxide ($ABO_3$) forming a perovskite structure. In an implementation, the seed layer 65 may include, e.g., ($SrTiO_{3-x}$), ($BaTiO_{3-x}$), or ($CaTiO_{3-x}$), in which $0<x<3$, x is a real number.

In an implementation, a concentration of oxygen at a portion of the seed layer 65 proximate to the lower electrode 55 may be less than a concentration of oxygen at a portion of the seed layer 65 distal to the lower electrode 55.

Figure 5:
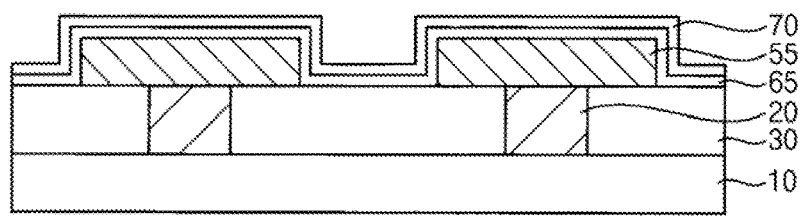

Referring to FIG. 5, a dielectric layer 70 may be conformally formed on the seed layer 65.

In an implementation, the dielectric layer 70 may include yet another ternary metal oxide forming or having a perovskite structure. In an implementation, the dielectric layer 70 may include, e.g., strontium titanate ($SrTiO_3$), barium titanate ($BaTiO_3$), or calcium titanate ($CaTiO_3$).

The dielectric layer 70 may be formed on the seed layer 65 including substantially the same material (e.g., including the same elements), and thus may be formed more effectively than if the dielectric layer 70 were to be formed on a layer containing a material different therefrom (e.g., containing different elements). In an implementation, the dielectric layer 70 may be formed by performing only a deposition process, e.g., a CVD process, an ALD process, or a PVD process, without performing an annealing process on the seed layer 65, or with performing only an annealing process at a relatively low temperature.

In an implementation, as illustrated in the drawing, the dielectric layer 70 may be formed to have substantially the same thickness as the seed layer 65. In an implementation, the dielectric layer 70 may be formed to have a thickness different from that of the seed layer 65.

Figure 6:
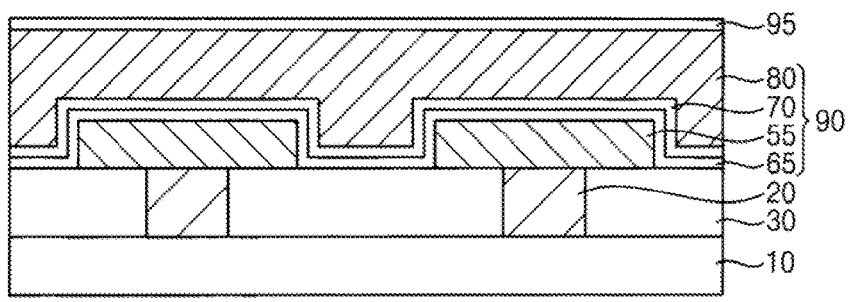

Referring to FIG. 6, an upper electrode 80 may be formed on the dielectric layer 70 to complete the fabrication of a capacitor structure 90 including the lower electrode 55, the seed layer 65, the dielectric layer 70, and the upper electrode 80 sequentially stacked on the substrate 10. A second insulating interlayer 95 may be formed to cover the capacitor structure 90.

The upper electrode 80 may be formed of, e.g., doped polysilicon and/or a metal, and the second insulating interlayer 95 may be formed of an oxide, e.g., silicon oxide.

As described above, the capacitor structure 90 may include the lower electrode 55, the seed layer 65, the dielectric layer 70, and the upper electrode 80 sequentially stacked on the substrate 10, and the lower electrode 55 may be formed by sequentially forming the preliminary lower electrode structure 50 and the capping layer 60 and performing an annealing process on the capping layer 60 and the preliminary lower electrode structure 50. The preliminary lower electrode structure 50 may be covered by the capping layer 60, the preliminary lower electrode structure 50 may not be volatilized by the annealing process, and the lower electrode 55 may be formed more effectively.

The preliminary lower electrode structure 50 may include the first oxide pattern 43, the preliminary lower electrode 45, and the second oxide pattern 47 sequentially stacked. The first and second oxide patterns 43 and 47 may provide oxygen (O) to the preliminary lower electrode 45 when the annealing process is performed, and the preliminary lower electrode 45 may provide ruthenium (Ru), molybdenum (Mo), cobalt (Co), or iridium (Ir) to each of the first and second oxide patterns 43 and 47, and thus the preliminary lower electrode 45 and the first and second oxide patterns 43 and 47 may effectively react to form the lower electrode 55 including a ternary metal oxide. For example, the different oxygen concentrations at different parts of the lower electrode 55 may be a result of the annealing process.

In an implementation, the first and second oxide patterns 43 and 47 may provide strontium (Sr), barium (Ba), or calcium (Ca) to the capping layer 60, and the capping layer 60 may react to form the seed layer 65 including another ternary metal oxide. Accordingly, the dielectric layer 70 may be formed on the seed layer 65 including substantially the same material (e.g., including the same elements), and thus may be formed more effectively than if the dielectric layer 70 were to be formed on a layer containing a material different therefrom (e.g., containing different elements).

In an implementation, the seed layer 65 and the dielectric layer 70 may include substantially the same ternary metal oxide (e.g., may include the same elements), and the lower electrode 55 may include a ternary metal oxide different therefrom (e.g., may include at least one different element). In an implementation, the ternary metal oxide included in the seed layer 65 may have a smaller oxygen concentration than that of the ternary metal oxide included in the dielectric layer 70.

FIGS. 7 to 24 are plan views and cross-sectional views of stages in a method of manufacturing a semiconductor device in accordance with example embodiments. FIGS. 7, 9, 17 and 23 are the plan views, and FIGS. 8, 10-16, 18-22 and 24 are the cross-sectional views. Each of FIGS. 8, 10-16, 18-22 and 24 includes cross-sectional views taken along lines A-A' and B-B' of corresponding plan views, respectively.

This method includes processes substantially the same as or similar to those described with reference to FIGS. 1 to 6, and thus repeated descriptions thereon may be omitted herein.

Figure 7:
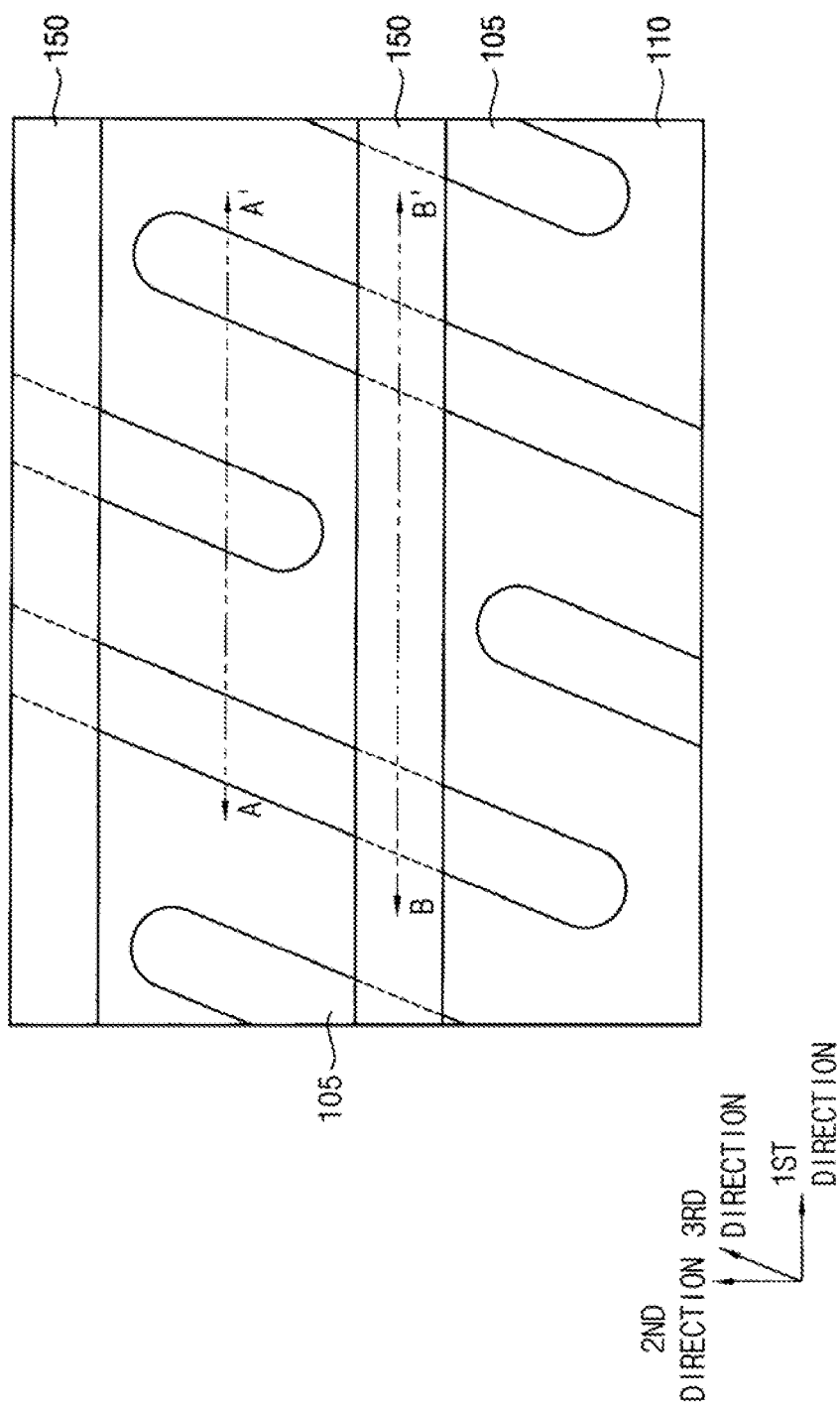
FIGS. 7 to 24 are plan views and cross-sectional views of stages in a method of manufacturing a semiconductor device in accordance with example embodiments.
Figure 8:
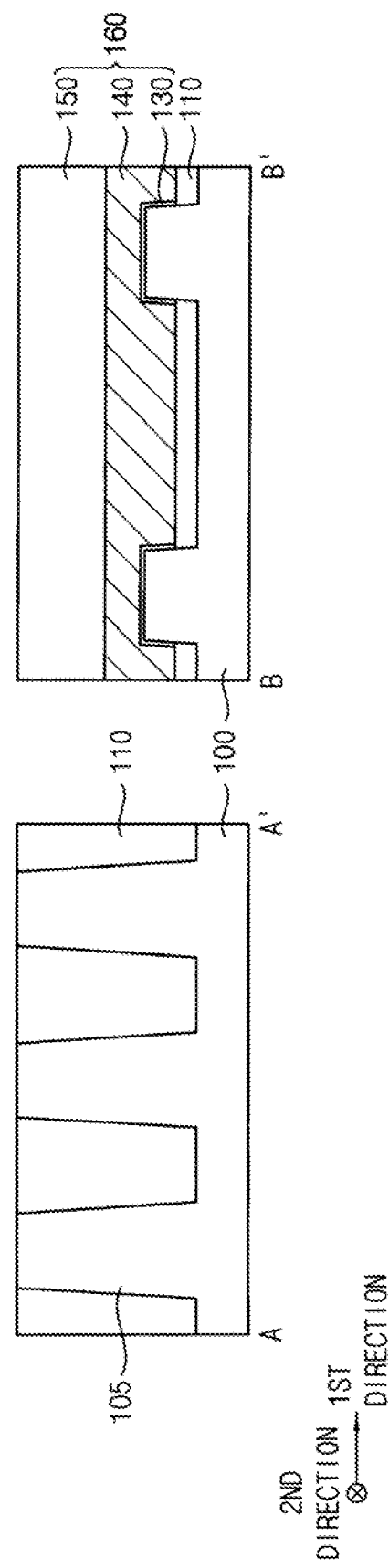

Referring to FIGS. 7 and 8, an active pattern 105 may be formed on a substrate 100, and an isolation pattern 110 may be formed to cover a sidewall of the active pattern 105.

The substrate 100 may include silicon, germanium, silicon-germanium, or a group III-V compound such as GaP, GaAs, GaSb, and the like. In an implementation, the substrate 100 may be a SOI substrate or a GOI substrate.

In an implementation, a plurality of active patterns 105 may be formed to be spaced apart from each other in each of the first and second directions, which are parallel to an upper surface of the substrate 100 and are orthogonal to each other, and each of the active patterns 105 may extend in a third direction that is parallel to the upper surface of the substrate 100 and is at an acute angle with the first and second directions.

The active pattern 105 may be formed by removing an upper portion of the substrate 100 to form a first recess, and the isolation pattern 110 may be formed by forming an isolation layer on the substrate 100 to fill the first recess and planarizing the isolation layer until an upper surface of the active pattern 105 is exposed. In an implementation, the planarization process may include a chemical mechanical polishing (CMP) process and/or an etch back process.

An impurity region may be formed at an upper portion of the substrate 100 by, e.g., an ion implantation process, and the active pattern 105 and the isolation pattern 110 may be partially etched to form a second recess extending in the first direction.

Figure 9:
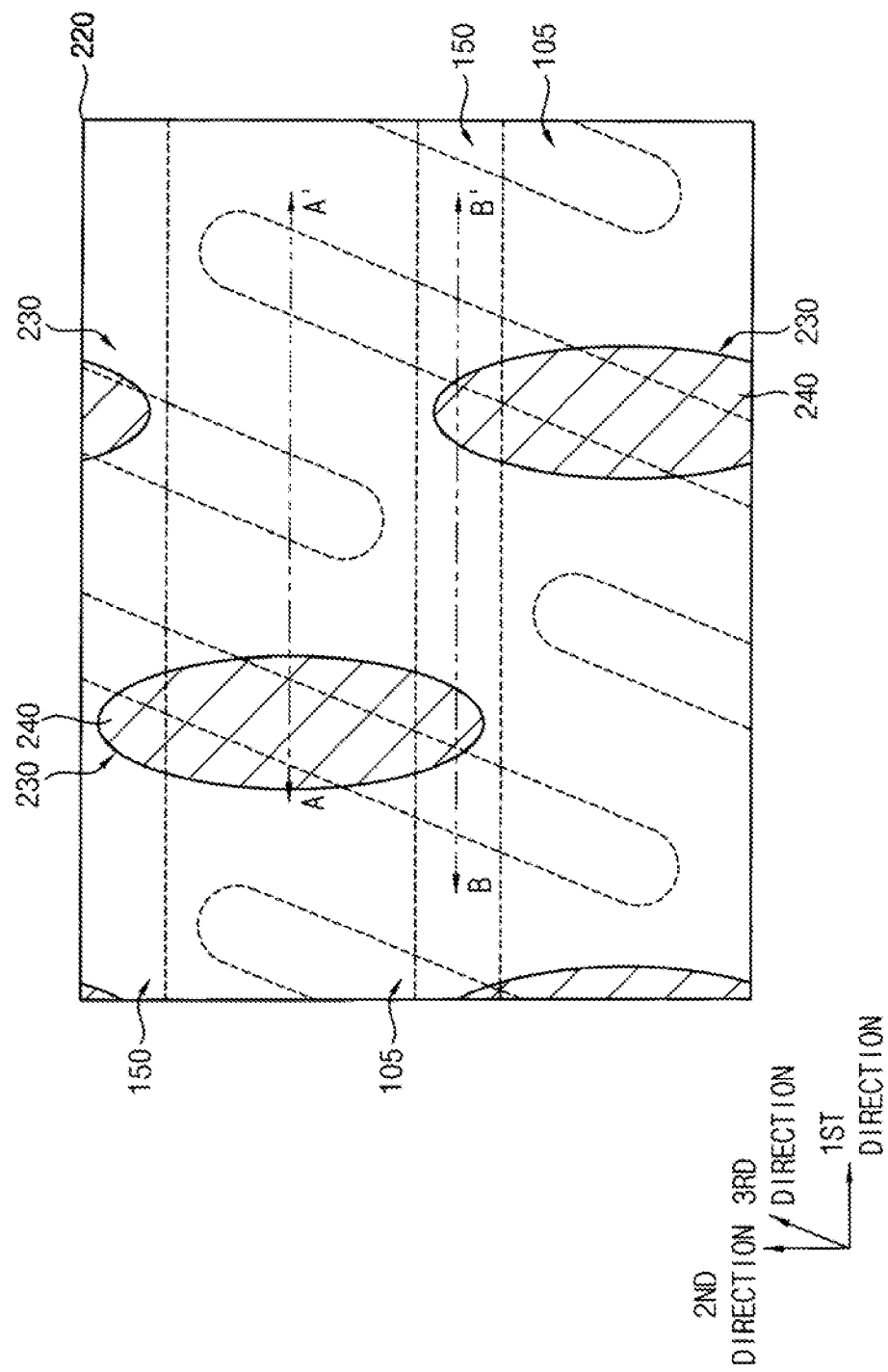
Figure 10:
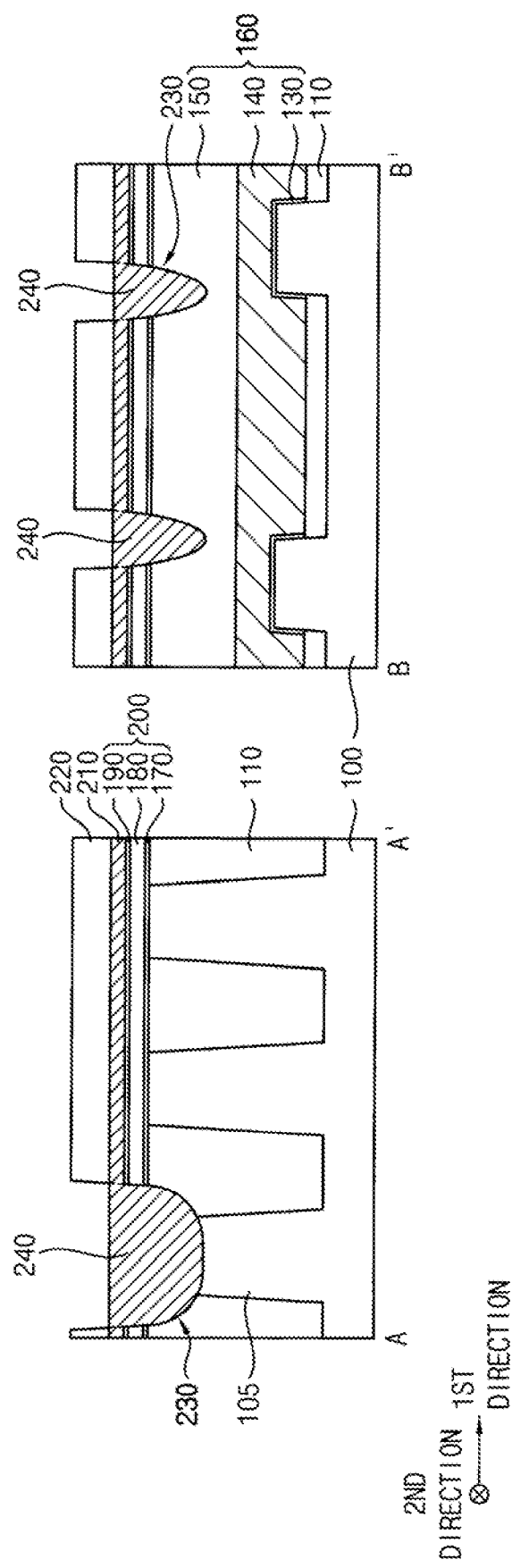

Referring to FIGS. 9 and 10, a gate structure 160 may be formed in the second recess, and an insulating layer structure 200, a first conductive layer 210, and a first etching mask 220 may be sequentially formed on the active pattern 105, the isolation pattern 110, and the gate structure 160.

The first conductive layer 210 and the insulating layer structure 200 may be etched using the first etching mask 220 to form a first opening 230 exposing an upper surface of the active pattern 105.

The gate structure 160 may be formed to include a gate insulating layer 130 on the active pattern 105 exposed by the second recess, a gate electrode 140 on the gate insulating layer 130, which may fill a lower portion of the second recess, and a gate mask 150 on the gate electrode 140, which may fill an upper portion of the second recess. The gate structure 160 may extend along the first direction, and a plurality of gate structures 160 may be formed to be spaced apart from each other along the second direction.

In an implementation, the gate insulating layer 130 may be formed by a thermal oxidation process on the active pattern 105 exposed by the second recess, and may be formed to include an oxide, e.g., silicon oxide.

The gate electrode 140 may be formed by forming a gate electrode layer on the gate insulating layer 130 and the isolation pattern 110 to fill the second recess, and removing an upper portion of the gate electrode layer by a CMP process and/or an etch back process. Accordingly, the gate electrode 140 may be formed in the lower portion of the second recess. The gate electrode layer may be formed of, e.g., a metal such as tungsten (W), titanium (Ti), or tantalum (Ta), or a metal nitride such as tungsten nitride, titanium nitride, or tantalum nitride.

The gate mask 150 may be formed by forming a gate mask layer on the gate electrode 140, the gate insulating layer 130, and the isolation pattern 110 to fill a remaining portion of the second recess, and planarizing an upper portion of the gate mask layer until an upper surface of the isolation pattern 110 is exposed. Accordingly, the gate mask 150 may be formed in the upper portion of the second recess. The gate mask layer may be formed to include a nitride, e.g., silicon nitride.

In an implementation, the insulating layer structure 200 may include first to third insulating layers 170, 180, and 190 sequentially stacked. The first insulating layer 170 may be formed of, e.g., an oxide such as silicon oxide, and the second insulating layer 180 may be formed of, e.g., a nitride such as silicon nitride, and the third insulating layer 190 may be formed of, e.g., an oxide such as silicon oxide.

The first conductive layer 210 may be formed to include, e.g., polysilicon doped with impurities, and the first etching mask 220 may be formed to include, e.g., a nitride such as silicon nitride.

During the etching process, an upper portion of the active pattern 105 and an upper portion of the isolation pattern 110 adjacent thereto, which are exposed by the first opening 230, and an upper portion of the gate mask 150 may be etched to form a third recess 230. In an implementation, a bottom of the first opening 230 may be also referred to as the third recess 230.

In an implementation, the first opening 230 may expose an upper surface of a central portion of each active pattern 105 extending in the third direction, and a plurality of first openings 230 may be formed in each of the first and second directions.

A second conductive layer 240 may be formed to fill the first opening 230.

In an implementation, the second conductive layer 240 may be formed by forming a preliminary second conductive layer on the active pattern 105, the isolation pattern 110, the gate mask 150 and the first etching mask 220 to fill the first opening 230, and removing an upper portion of the preliminary second conductive layer by a CMP process and/or an etch back process. Accordingly, the second conductive layer 240 may be formed to have an upper surface substantially coplanar with an upper surface of the first conductive layer 210.

In an implementation, a plurality of second conductive layers 240 may be formed in each of the first and second directions to be spaced apart from each other. The second conductive layer 240 may be formed to include, e.g., polysilicon doped with impurities. In an implementation, the second conductive layer 240 may be merged with the first conductive layer 210.

Figure 11:
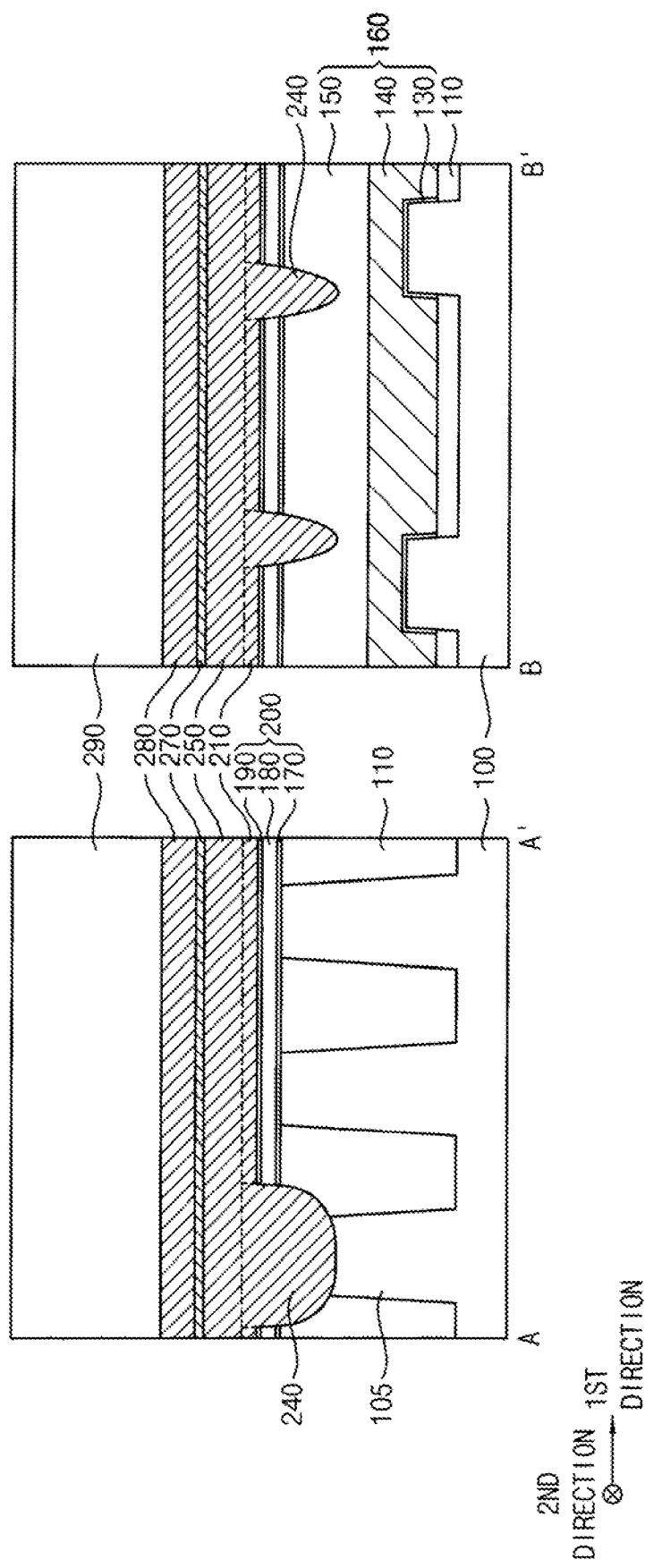

Referring to FIG. 11, after removing the first etching mask 220, a third conductive layer 250, a barrier layer 270, a first metal layer 280, and a first capping layer 290 may be sequentially formed on the first and second conductive layers 210 and 240.

In an implementation, the third conductive layer 250 may be formed to include substantially the same material as the first and second conductive layers 210 and 240. That is, the third conductive layer 250 may be formed to include polysilicon doped with impurities, and in some embodiments, may be merged with the first and second conductive layers 210 and 240.

The barrier layer 270 may be formed to include, e.g., a metal such as titanium (Ti), tantalum (Ta), or the like, and/or a metal nitride such as titanium nitride, tantalum nitride, or the like. The first metal layer 280 may be formed to include, e.g., a metal such as tungsten (W). The first capping layer 290 may be formed to include, e.g., a nitride such as silicon nitride.

Figure 12:
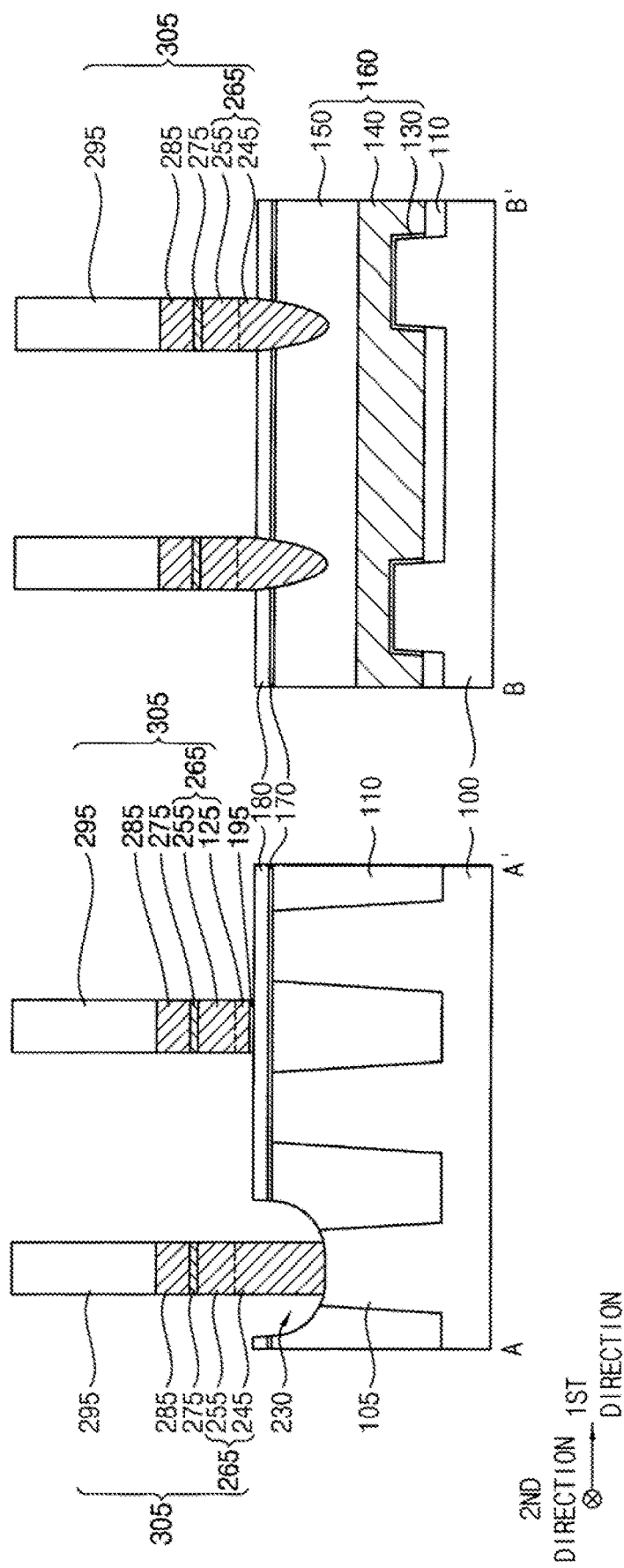

Referring to FIG. 12, the first capping layer 290 may be etched to form a first capping pattern 295, and the first metal layer 280, the barrier layer 270, the third conductive layer 250, and the first and second conductive layers 210 and 240 may be sequentially etched using the first capping pattern 295 as an etching mask. During the etching process, the third insulating layer 190 at an uppermost level of the insulating layer structure 200 may be also etched.

Accordingly, a second conductive pattern 245, a third conductive pattern 255, a barrier pattern 275, a first metal pattern 285, and the first capping pattern 295 may be sequentially stacked on the active pattern 105, the isolation pattern 110, and the gate mask 150 in the first opening 230, and a third insulating pattern 195, the first conductive pattern 215, the third conductive pattern 255, the barrier pattern 275, the first metal pattern 285, and the first capping pattern 295 may be sequentially stacked on the second insulating layer 180 of the insulating layer structure 200 at an outside of the first opening 230.

In an implementation, the first to third conductive layers 210, 240, and 250 may be merged with each other, and the second and third conductive patterns 245 and 255 sequentially stacked may form a conductive pattern structure 265, and also the first and third conductive patterns 215 and 255 sequentially stacked may form the conductive pattern structure 265. Hereinafter, the conductive pattern structures 265, the barrier pattern 275, the first metal pattern 285, and the first capping pattern 295 sequentially stacked may be referred to as a bit line structure 305.

In an implementation, the bit line structure 305 may extend in the second direction, and a plurality of bit line structures 305 may be formed in the first direction.

Figure 13:
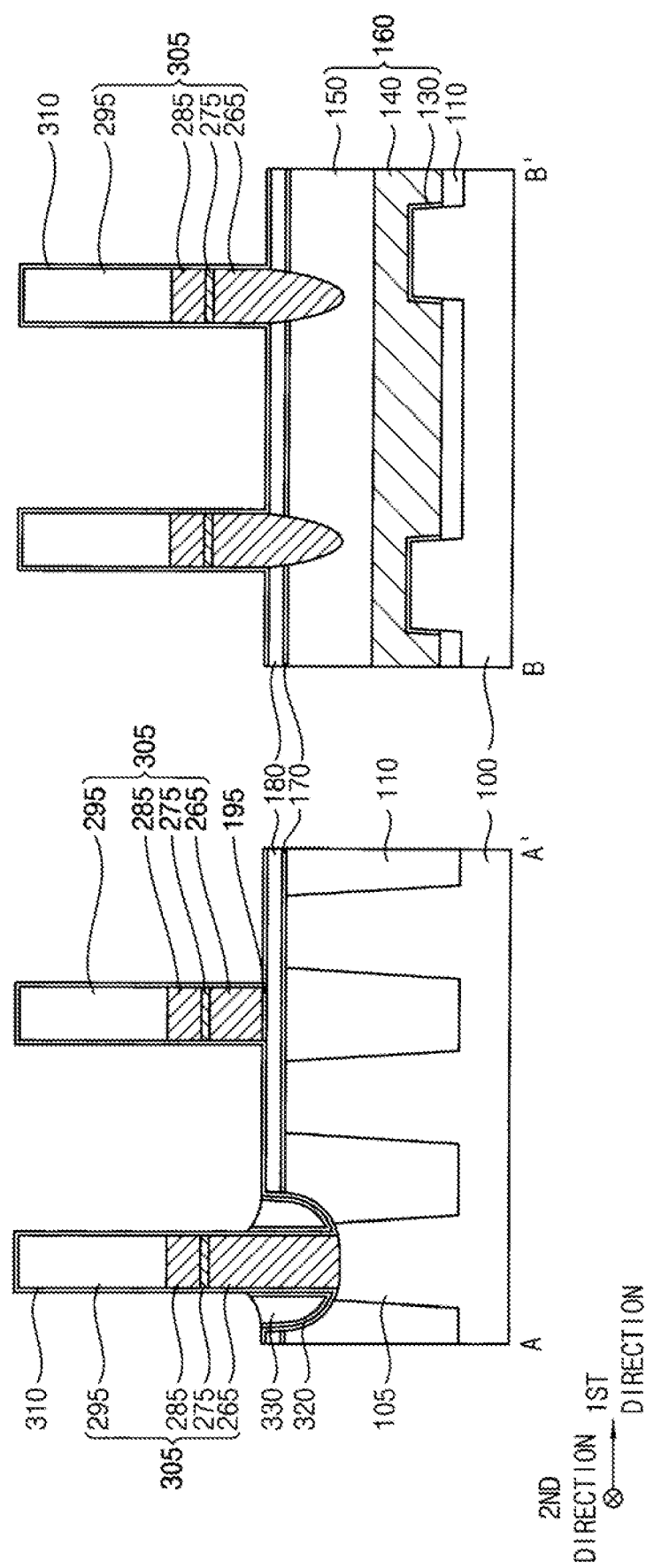

Referring to FIG. 13, a first spacer layer 310 may be formed on the upper surfaces of the active pattern 105, the isolation pattern 110, and the gate mask 150 exposed by the first opening 230, a sidewall of the first opening 230, and an upper surface of the second insulating layer 180 to cover the bit line structure 305, and fourth and fifth insulating layers may be sequentially formed on the first spacer layer 310.

The first spacer layer 310 may also cover a sidewall of the third insulating pattern 195 under a portion of the bit line structure 305 on the second insulating layer 180. The first spacer layer 310 may be formed to include, e.g., a nitride such as silicon nitride.

The fourth insulating layer may be formed to include, e.g., an oxide such as silicon oxide. The fifth insulating layer may be formed to include, e.g., a nitride such as silicon nitride. The fifth insulating layer may be formed to fill an entire portion of the first opening 230.

The fourth and fifth insulating layers may be etched by an etching process. In an implementation, the etching process may be performed by a wet etching process, and all remaining portions of the fourth and fifth insulating layers except for a portion in the first opening 230 may be removed. Accordingly, almost an entire surface of the first spacer layer 310, e.g., an entire portion of the first spacer layer 310 except for the portion in the first opening 230 may be exposed. Portions of the fourth and fifth insulating layers remaining in the first opening 230 may form fourth and fifth insulating patterns 320 and 330, respectively.

Figure 14:
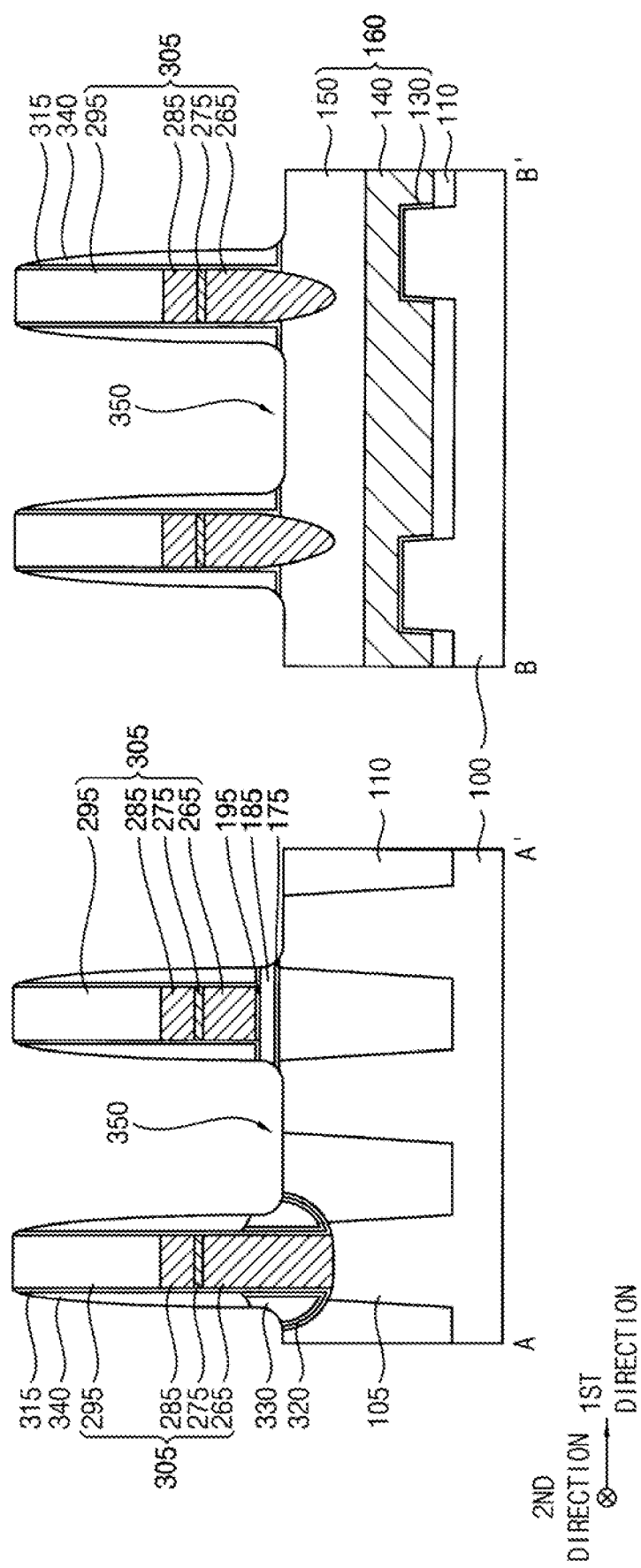

Referring to FIG. 14, a second spacer layer may be formed on the exposed surface of the first spacer layer 310 and the fourth and fifth insulating patterns 320 and 330 in the first opening 230, and may be anisotropically etched to form a second spacer 340 covering a sidewall of the bit line structure 305 on the surface of the first spacer layer 310 and the fourth and fifth insulating patterns 320 and 330.

The second spacer 340 may be formed to include, e.g., an oxide such as silicon oxide.

A second opening 350 may be formed by a dry etching process using the first capping pattern 295 and the second spacer 340 as an etching mask to expose the upper surface of the active pattern 105, and the upper surfaces of the isolation pattern 110 and the gate mask 150 may be also exposed by the second opening 350.

By the dry etching process, a portion of the first spacer layer 310 on upper surfaces of the first capping pattern 295 and the second insulating layer 180 may be removed to form a first spacer 315 covering a sidewall of the bit line structure 305. During the dry etching process, the first and second insulating layers 170 and 180 may be also be partially removed to remain as first and second insulating patterns 175 and 185, respectively. The first to third insulating patterns 175, 185, and 195 sequentially stacked under the bit line structure 305 may form an insulating pattern structure.

Figure 15:
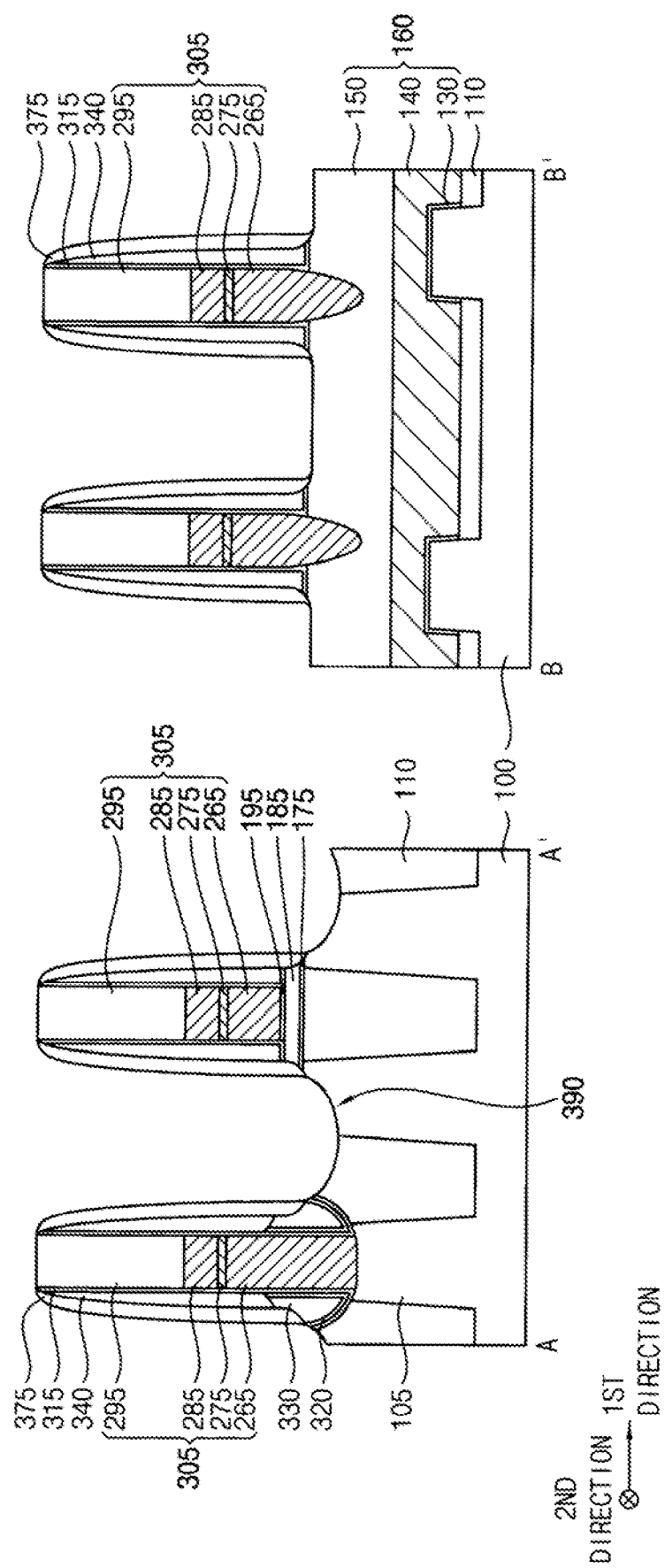

Referring to FIG. 15, a third spacer layer 370 may be formed on the upper surface of the first capping pattern 295, an upper surface of the first spacer 315, an outer sidewall of the second spacer 340, portions of upper surfaces of the fourth and fifth insulating patterns 320 and 330, and the upper surfaces of the active pattern 105, the isolation pattern 110, and the gate mask 150 exposed by the second opening 350, and may be anisotropically etched to form a third spacer 375 covering the sidewall of the bit line structure 305.

The first to third spacers 315, 340, and 375 sequentially stacked along a horizontal direction parallel to the upper surface of the substrate 100 on the sidewall of the bit line structure 305 may be referred to as a preliminary spacer structure.

An upper portion of the active pattern 105 may be etched by an additional etching process to form a fourth recess 390 connected with the second opening 350.

In an implementation, the etching process may be performed by a wet etching process. In the wet etching process, an upper portion of the isolation pattern 110 adjacent to the upper portion of the active pattern 105 may be also etched, and the third spacer 375, the first capping pattern 295 and the gate mask 150 including a material having an etching selectivity with respect to the active pattern 105 and the isolation pattern 110, e.g., a nitride may be hardly etched.

Figure 16:
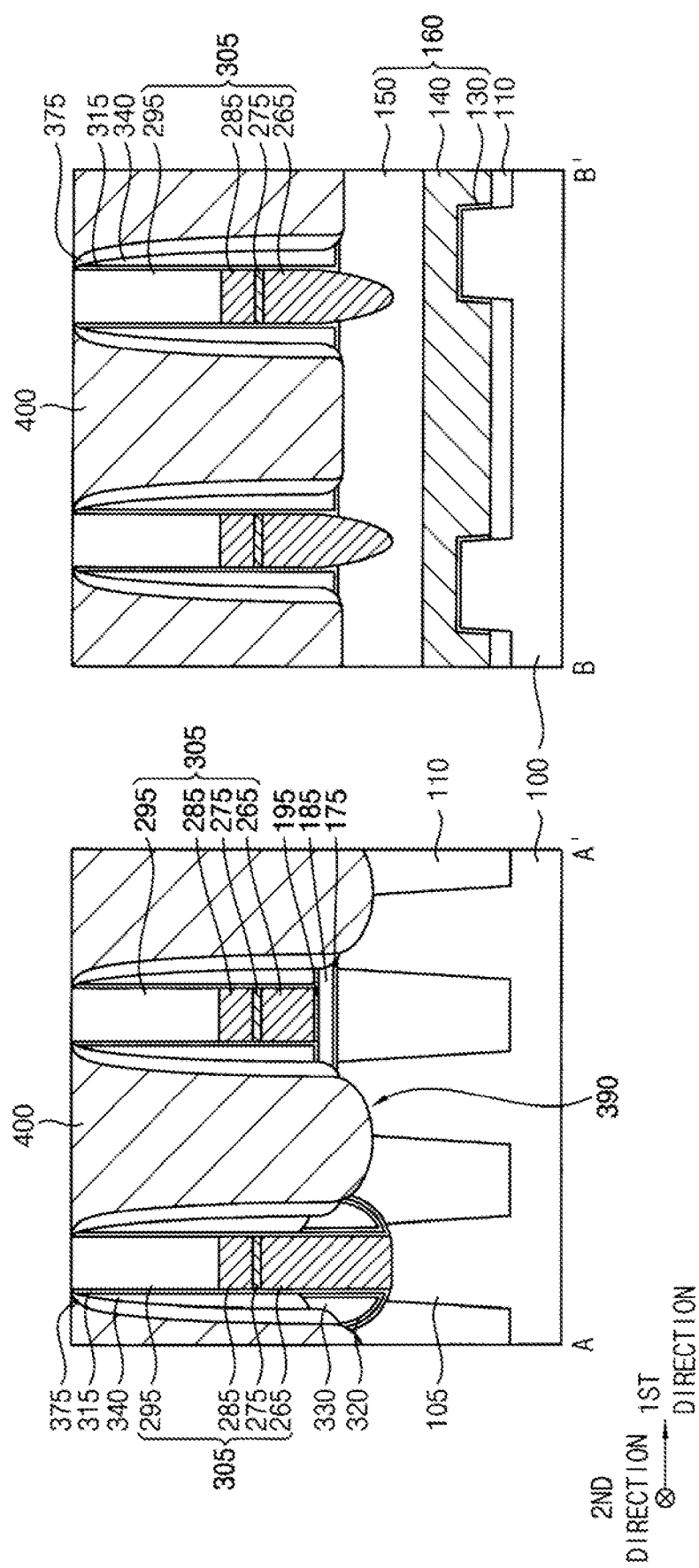

Referring to FIG. 16, a lower contact plug layer 400 may be formed to a sufficient height to fill the second opening 350 and the fourth recess 390, and may be planarized until the upper surface of the first capping pattern 295 is exposed.

In an implementation, the lower contact plug layer 400 may extend in the second direction, and a plurality of lower contact plug layers 400 may be formed to be spaced apart from each other by the bit line structures 305 along the first direction.

Figure 17:
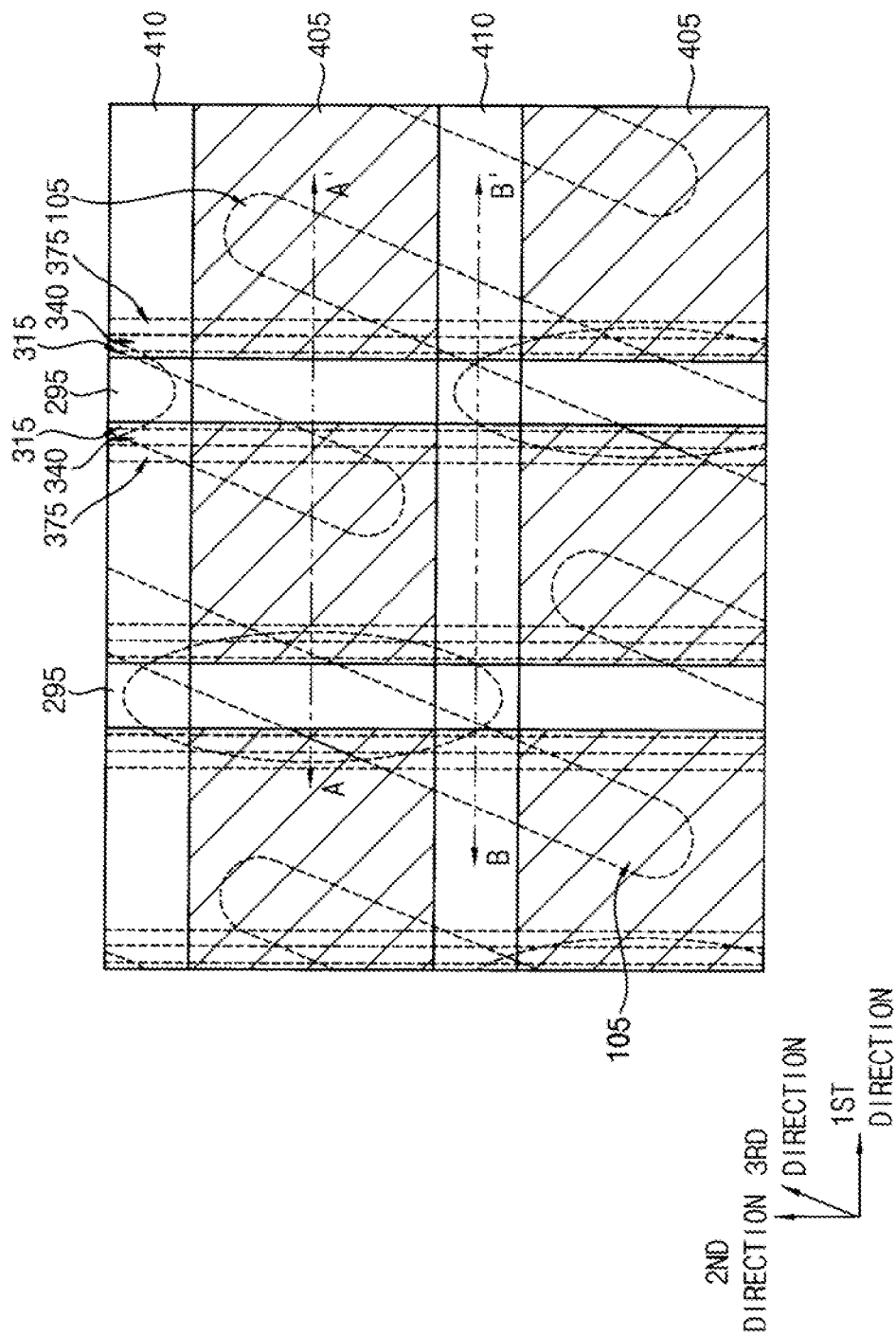
Figure 18:
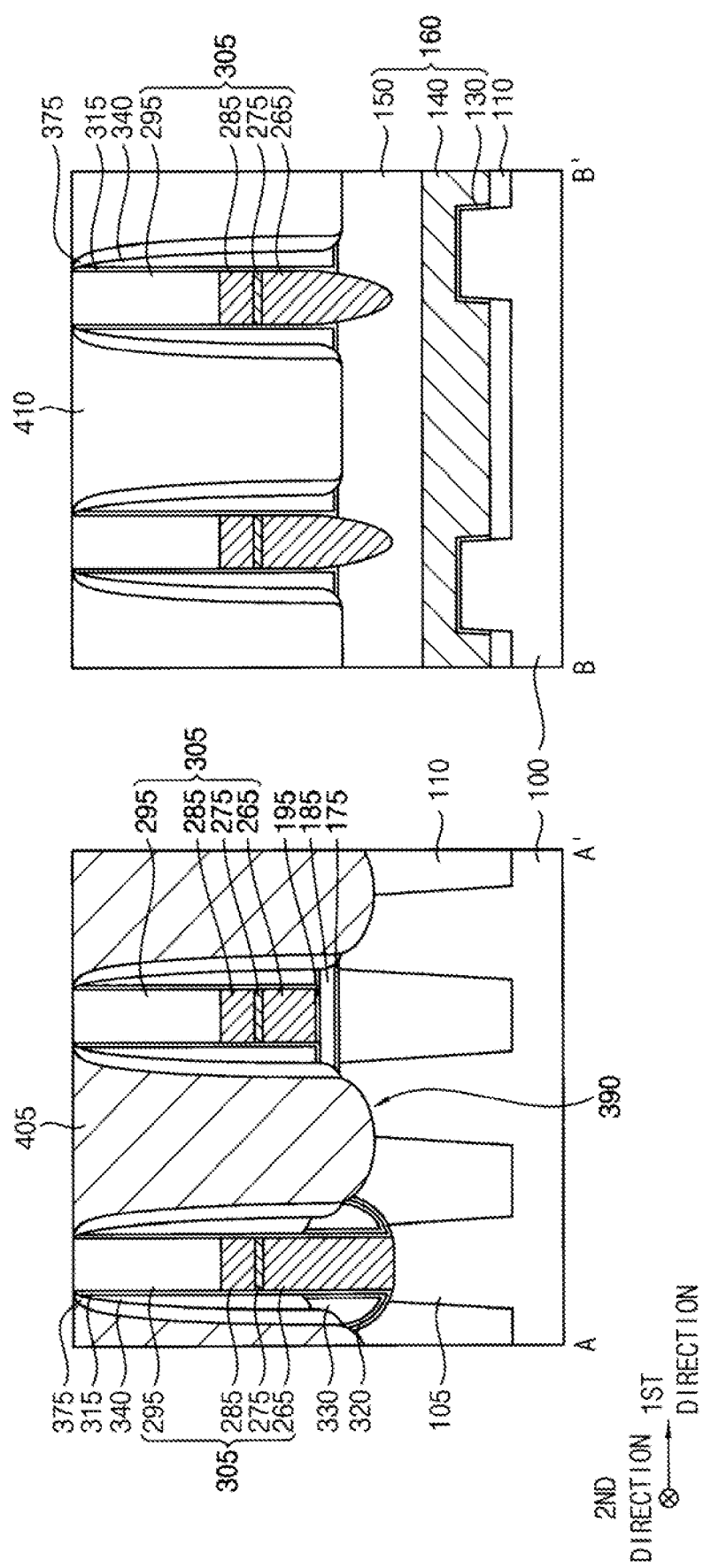

Referring to FIGS. 17 and 18, a fourth mask including a plurality of third openings, each of which may extend in the first direction, spaced apart from each other in the second direction may be formed on the first capping pattern 295 and the lower contact plug layer 400, and the lower contact plug layer 400 may be etched by an etching process using the fourth mask as an etching mask.

In an implementation, each of the third openings may overlap the gate structure 160 in a vertical direction perpendicular to the upper surface of the substrate 100. As the etching process is performed, a fourth opening exposing the upper surface of the gate mask 150 of the gate structure 160 may be formed between the bit line structures 305, and after removing the fourth mask, a second capping pattern 410 may be formed to fill the fourth opening. In example embodiments, the second capping pattern 410 may extend between the bit line structures 305 in the first direction, and a plurality of second capping patterns 410 may be formed along the second direction.

Accordingly, the lower contact plug layer 400 extending in the second direction between the bit line structures 305 may be transformed into a plurality of lower contact plugs 405 spaced apart from each other along the second direction by the second capping patterns 410.

Figure 19:
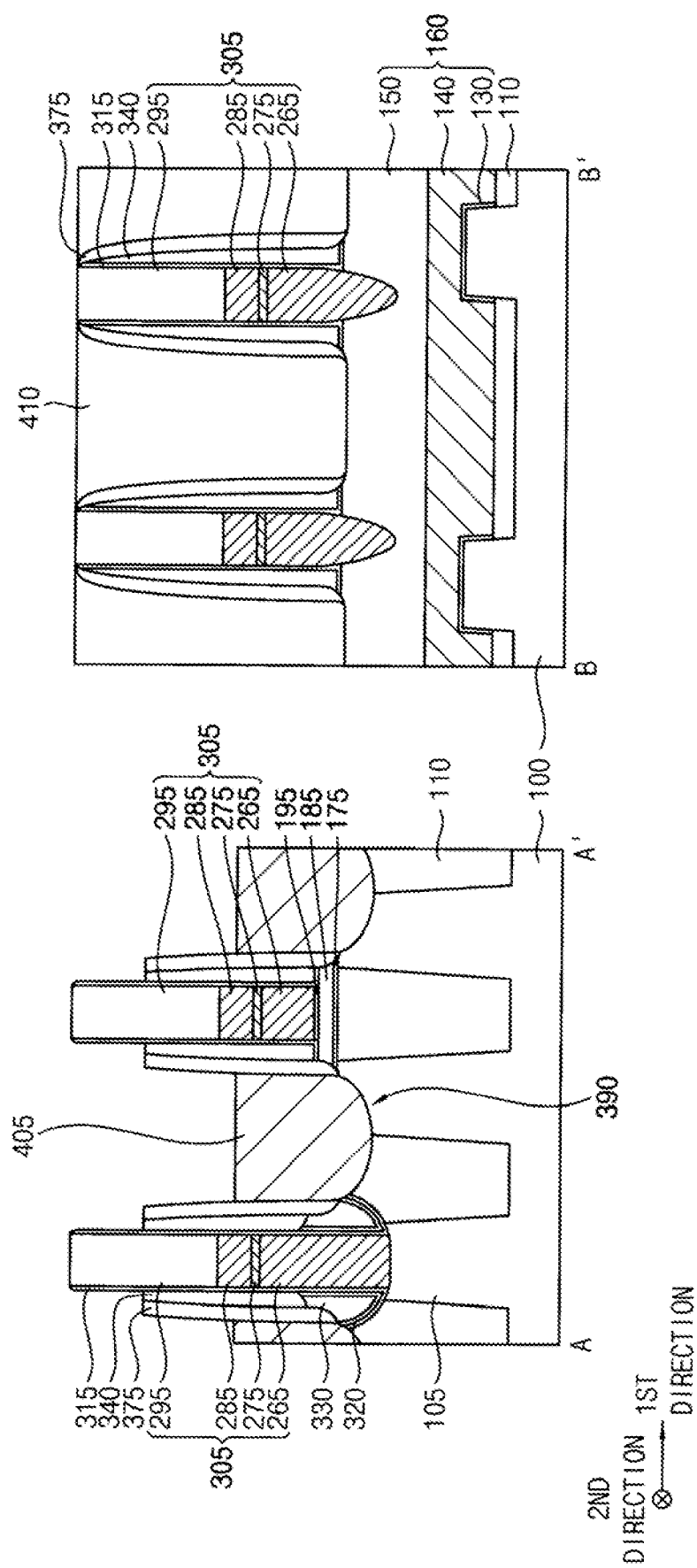

Referring to FIG. 19, an upper portion of the lower contact plug 405 may be removed to expose an upper portion of the preliminary spacer structure on the sidewall of the bit line structure 305, and upper portions of the second and third spacers 340 and 375 of the exposed preliminary spacer structure may be removed. An upper portion of the lower contact plug 405 may be further removed.

In an implementation, an upper surface of the lower contact plug 405 may be lower than uppermost surfaces of the second and third spacers 340 and 375.

Figure 20:
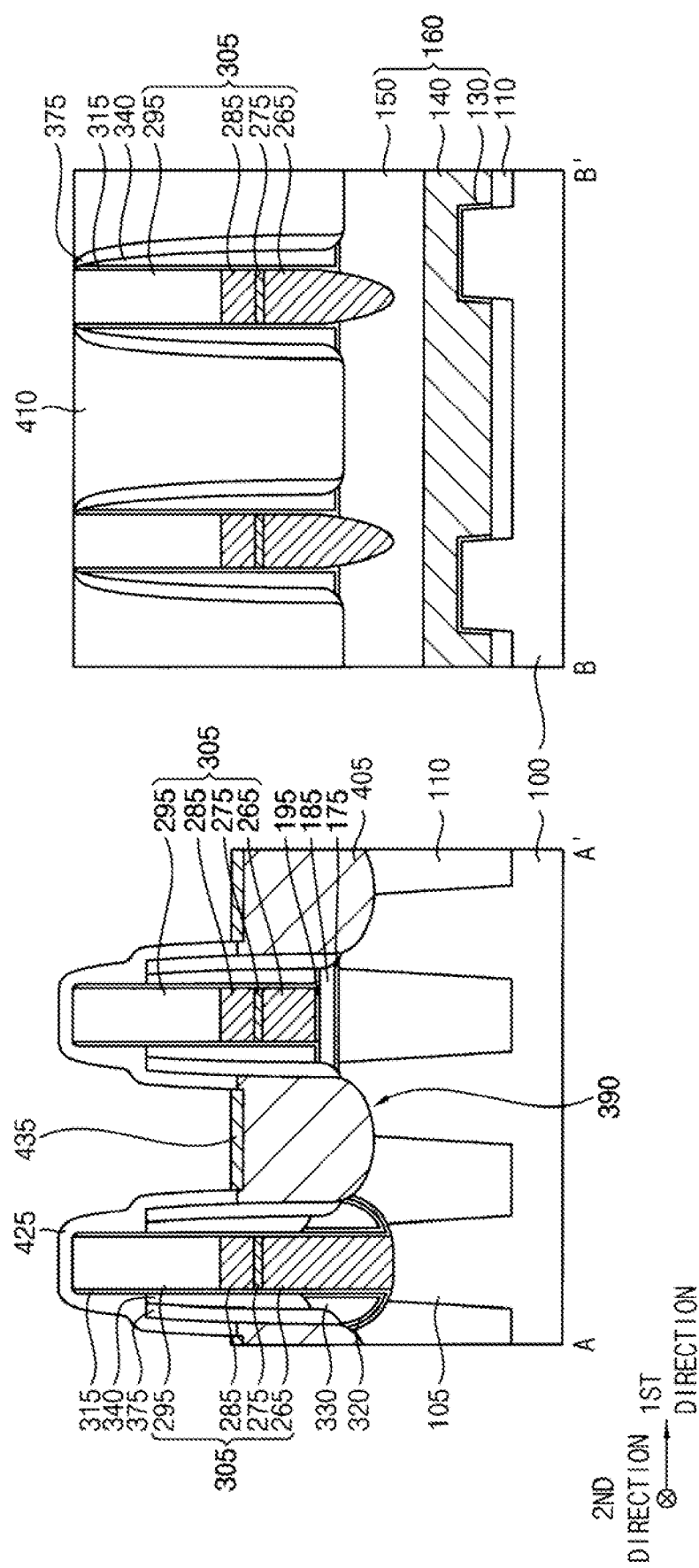

Referring to FIG. 20, a fourth spacer layer may be formed on the bit line structure 305, the preliminary spacer structure, the first and second capping patterns 295 and 410, and the lower contact plug 405, and may be anisotropically etched to form a fourth spacer 425 covering the first to third spacers 315, 340, and 375 on each of opposite sidewalls of the bit line structure 305 in the first direction, and thus the upper surface of the lower contact plug 405 may be exposed.

A metal silicide pattern 435 may be formed on the exposed upper surface of the lower contact plug 405. In example embodiments, the metal silicide pattern 435 may be formed by forming a second metal layer on the first and second capping patterns 295 and 410, the fourth spacer 425, and the lower contact plug 405, performing a heat treatment on the second metal layer, and removing an unreacted portion of the second metal layer.

Figure 21:
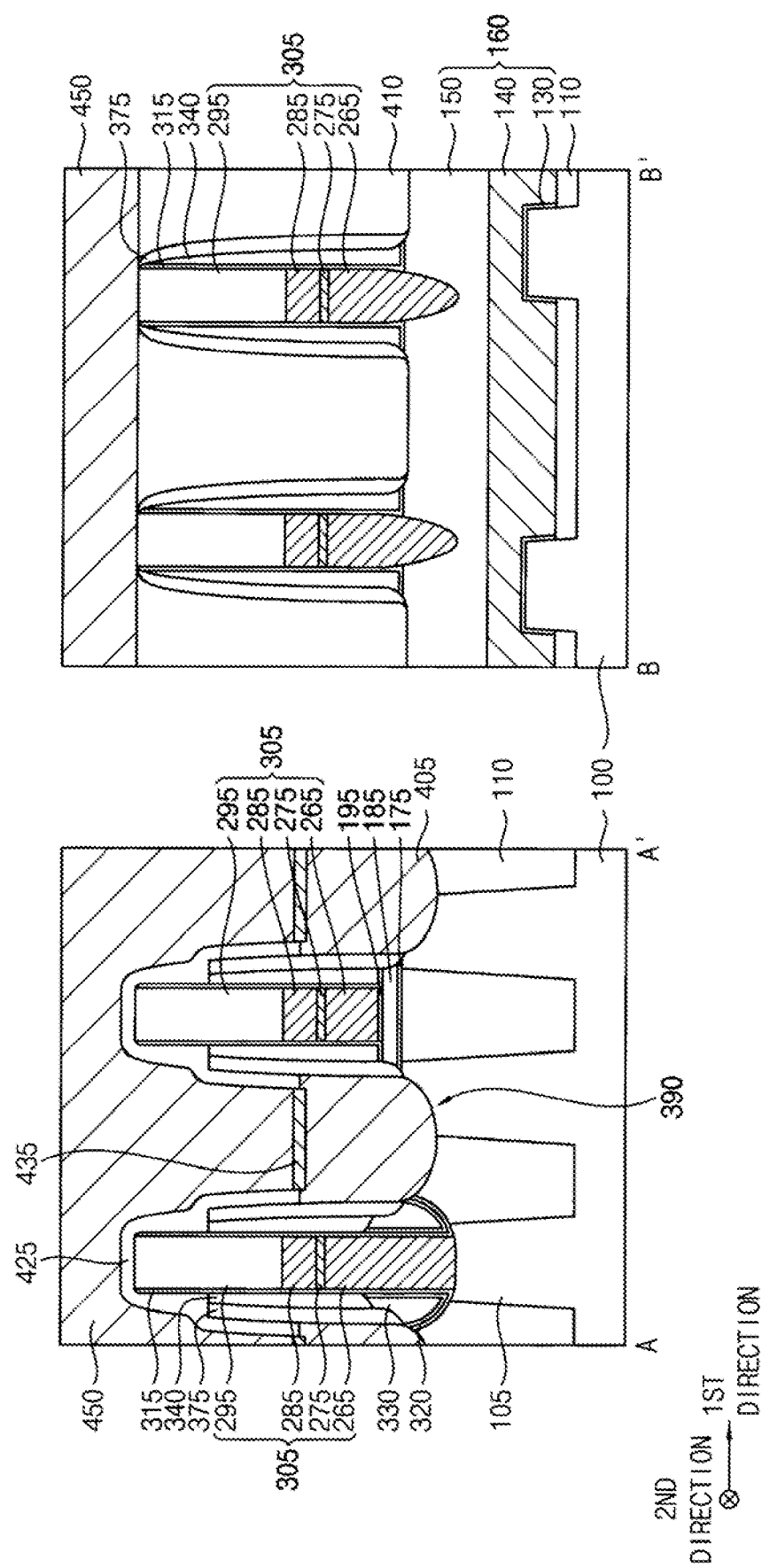

Referring to FIG. 21, an upper contact plug layer 450 may be formed on the first and second capping patterns 295 and 410, the first to fourth spacers 315, 340, 375, and 425, the metal silicide pattern 435, and the lower contact plug 405, and an upper portion of the upper contact plug layer 450 may be planarized.

In example embodiments, an upper surface of the upper contact plug layer 450 may be higher than upper surfaces of the first and second capping patterns 295 and 410.

Figure 22:
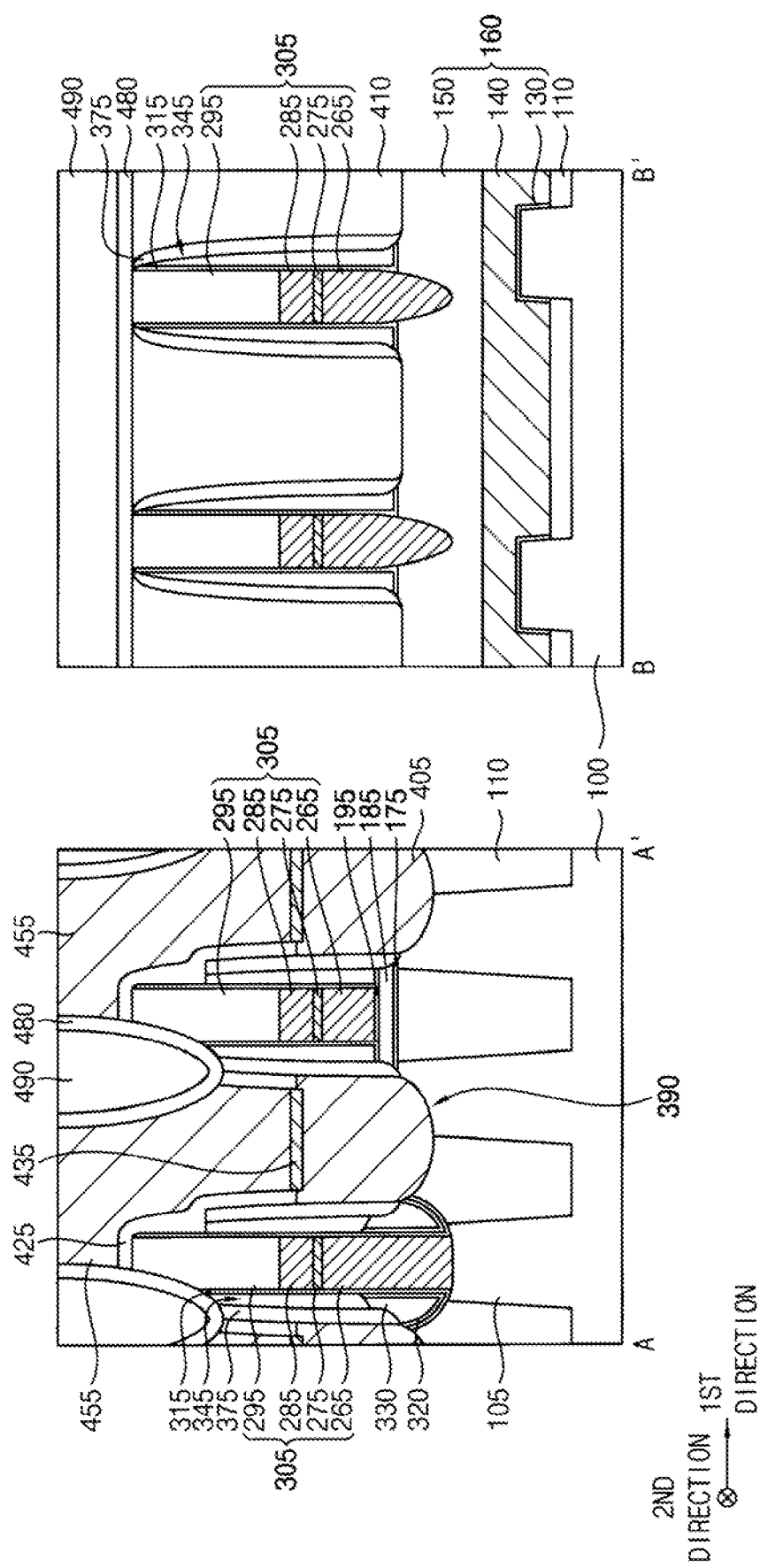

Referring to FIG. 22, the upper contact plug layer 450 may be patterned to form a fifth recess, and a first insulating interlayer structure including sixth and seventh insulating layers 480 and 490 sequentially stacked may be formed in the fifth recess. The first insulating interlayer structure may be also formed on the second capping pattern 410.

The fifth recess may be formed by removing an upper portion of the upper contact plug layer 450, an upper portion of the first capping pattern 295, and upper portions of the first, third, and fourth spacers 315, 375, and 425. Accordingly, an upper surface of the second spacer 340 may be exposed.

As the fifth recess is formed, the upper contact plug layer 450 may be transformed into an upper contact plug 455. In an implementation, a plurality of upper contact plugs 455 may be formed to be spaced apart from each other in each of the first and second directions, and may be arranged in a honeycomb shape in a plan view. Each of the upper contact plugs 455 may have a circular, elliptical or polygonal shape in a plan view.

The lower contact plug 405, the metal silicide pattern 435, and the upper contact plug 455 sequentially stacked may form a contact plug structure.

The exposed second spacer 340 may be removed to form an air gap 345 connected with the fifth recess. The second spacer 340 may be removed, e.g., by a wet etching process.

A second insulating interlayer 480 may be formed using a material having a low gap-filling property, so that the air gap 345 under the fifth recess may not be filled, but remain. The air gap 345 may be also referred to as an air spacer 345, and may form a spacer structure together with the first, third, and fourth spacers 315, 375, and 425. In an implementation, the air gap 345 may be a spacer including air.

Figure 23:
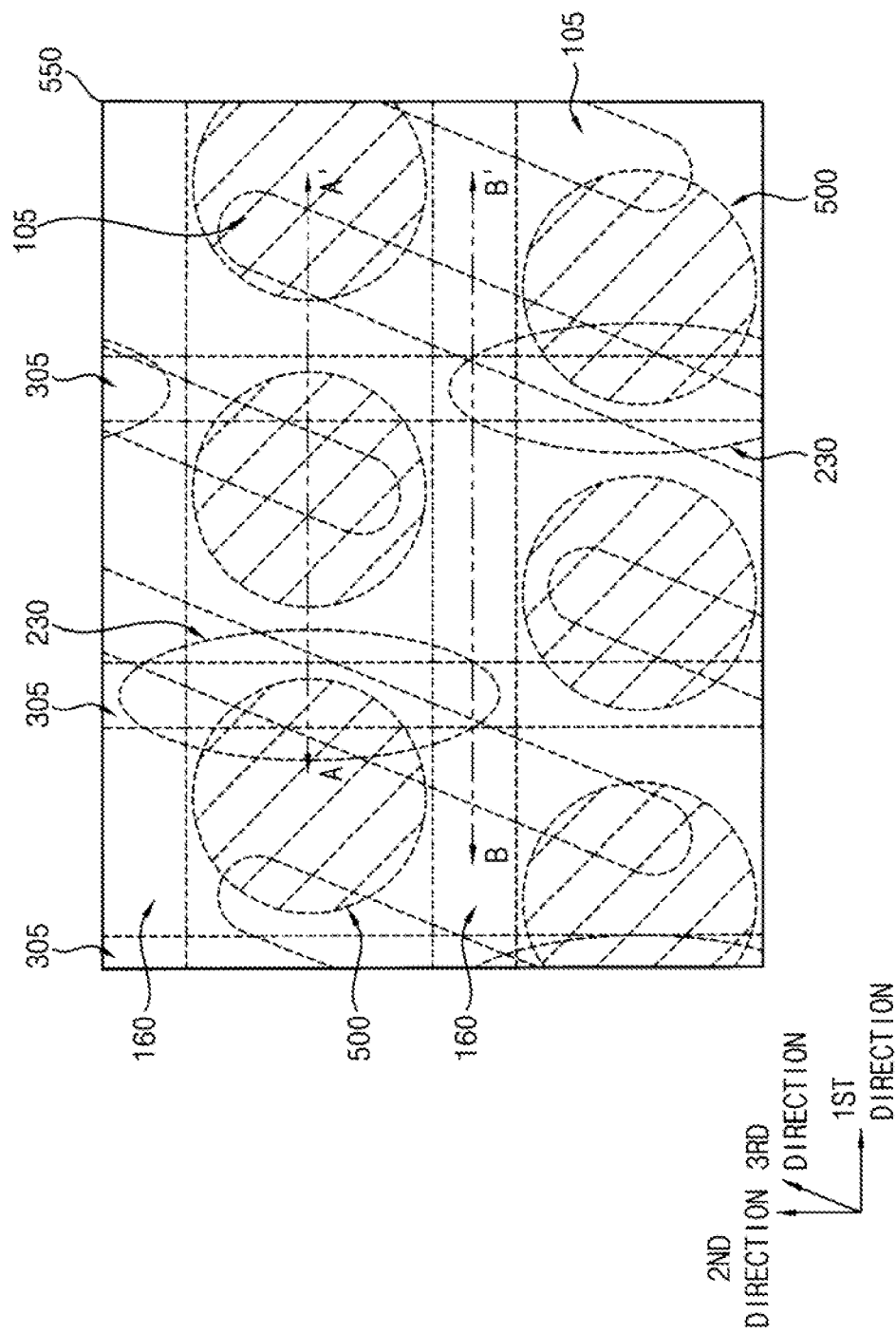
Figure 24:
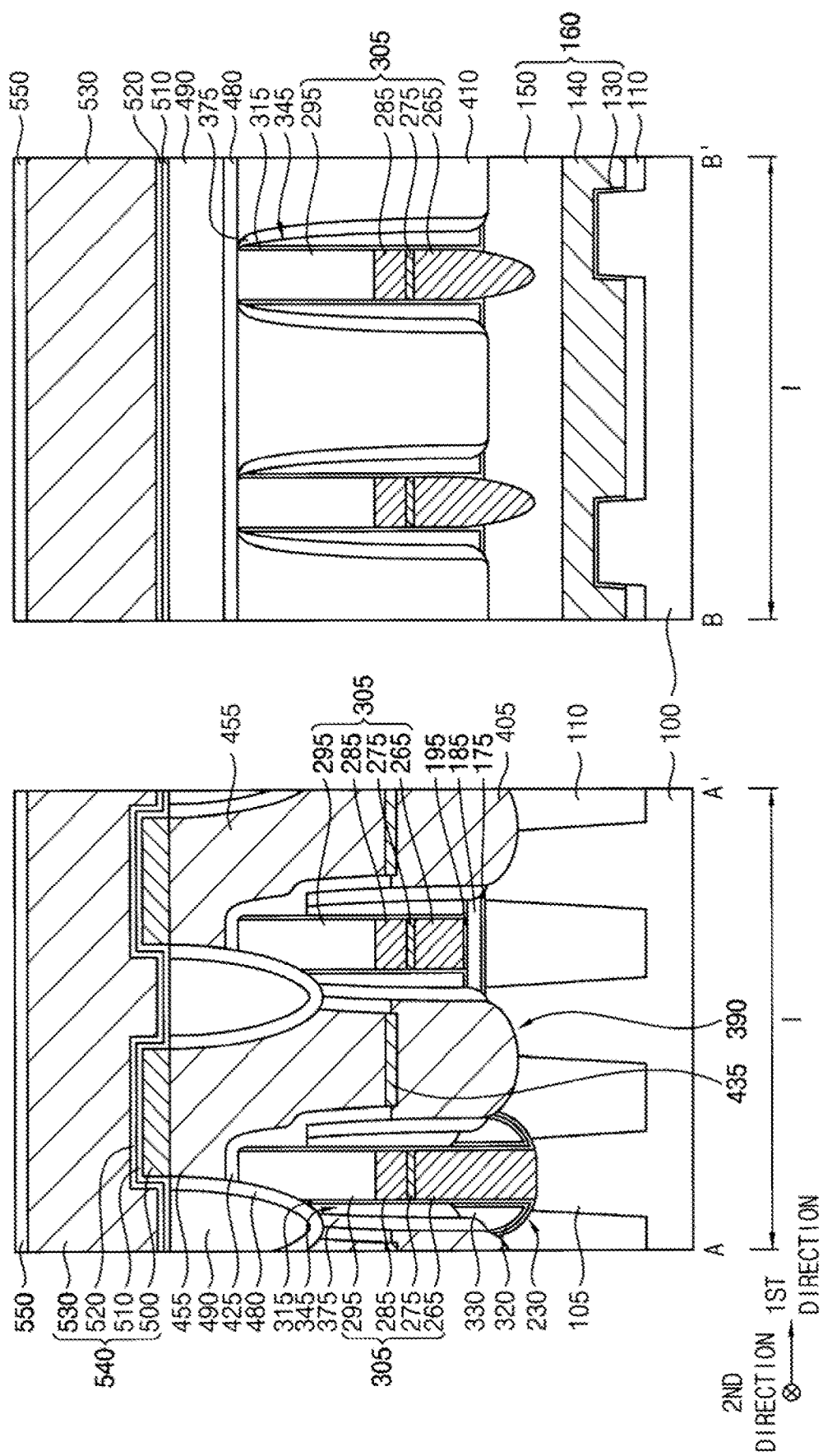

Referring to FIGS. 23 and 24, processes substantially the same as or similar to those illustrated with reference to FIGS. 1 to 6 may be performed to complete the fabrication of the semiconductor device.

In an implementation, a preliminary lower electrode structure including a first oxide pattern, a preliminary lower electrode pattern, and a second oxide pattern sequentially stacked may be formed on the upper contact plugs 455 and the sixth and seventh insulating layers 480 and 490, a capping layer may be conformally formed on the preliminary lower electrode structure, and an annealing process may be performed on the capping layer to form a lower electrode 500 and a seed layer 510 sequentially stacked.

A dielectric layer 520 and an upper electrode 530 may be sequentially formed on the seed layer 510 to form a capacitor structure 540 including the lower electrode 500, the seed layer 510, a dielectric layer 520, and an upper electrode 530. A second insulating interlayer 550 may be formed to cover the capacitor structure 540 so that the fabrication of the semiconductor device may be completed.

By way of summation and review, in an effort to help improve the electrical characteristics of the capacitor structure, an annealing process may be performed on a lower electrode layer containing different types of metal oxides, so that the lower electrode may be formed from the lower electrode layer to include a ternary metal oxide. The lower electrode layer could be volatilized by the annealing process, so that the lower electrode may not to be properly formed.

One or more embodiments may provide a capacitor structure having improved electrical characteristics.

One or more embodiments may provide a semiconductor device having improved electrical characteristics.

In a manufacturing process of the capacitor structure according to example embodiments, the capacitor structure may be formed to include the lower electrode, the seed layer, the dielectric layer, and the upper electrode sequentially stacked on the substrate. The lower electrode may be formed by sequentially forming a preliminary lower electrode structure and a capping layer, and performing an annealing process on the capping layer. The preliminary lower electrode structure may be covered by the capping layer, the preliminary lower electrode structure may not be volatilized by the annealing process, and the lower electrode may be formed more effectively.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A capacitor structure, comprising:
   a lower electrode on a substrate;
   a seed layer on the lower electrode;
   a dielectric layer directly on and in contact with the seed layer; and
   an upper electrode on the dielectric layer,
   wherein:
   the dielectric layer includes $SrTiO_3$, $BaTiO_3$, or $CaTiO_3$, and
   the seed layer includes $SrTiO_{3-x}$, $BaTiO_{3-x}$, or $CaTiO_{3-x}$, in which $0<x<3$, and x is a real number, such that when the dielectric layer includes $SrTiO_3$, the seed layer includes $SrTiO_{3-x}$, when the dielectric layer includes $BaTiO_3$, the seed layer includes $BaTiO_{3-x}$, and when the dielectric layer includes $CaTiO_3$, the seed layer includes $CaTiO_{3-x}$, and
   the $SrTiO_3$, $BaTiO_3$, or $CaTiO_3$ of the dielectric layer directly contacts the $SrTiO_{3-x}$, $BaTiO_{3-x}$, or $CaTiO_{3-x}$ of the seed layer.

2. The capacitor structure as claimed in claim 1, wherein the lower electrode includes a ternary metal oxide.

3. The capacitor structure as claimed in claim 2, wherein the lower electrode includes:
   oxygen (O),
   one of ruthenium (Ru), molybdenum (Mo), cobalt (Co), or iridium (Ir), and
   one of strontium (Sr), barium (Ba), or calcium (Ca).

4. The capacitor structure as claimed in claim 3, wherein the lower electrode includes $SrRuO_3$, $SrMoO_3$, $SrCoO_3$, $SrIrO_3$, $BaRuO_3$, $BaMoO_3$, $BaCoO_3$, $BaIrO_3$, $CaRuO_3$, $CaMoO_3$, $CaCoO_3$, or $CaIrO_3$.

5. The capacitor structure as claimed in claim 1, wherein a concentration of oxygen at a portion of the seed layer proximate to the lower electrode is less than a concentration of oxygen at a portion of the seed layer distal to the lower electrode.

6. The capacitor structure as claimed in claim 1, wherein a concentration of oxygen at a central portion of the lower electrode is greater than a concentration of oxygen at a portion thereof that is distal to the substrate and is greater than a concentration of oxygen at a portion thereof that is proximate to the substrate.

7. A capacitor structure, comprising:
   a lower electrode on a substrate;
   a seed layer on the lower electrode;
   a dielectric layer directly on and in contact with the seed layer; and
   an upper electrode on the dielectric layer,
   wherein:
   the dielectric layer includes $SrTiO_3$, $BaTiO_3$, or $CaTiO_3$,
   the seed layer includes $SrTiO_{3-x}$, $BaTiO_{3-x}$, or $CaTiO_{3-x}$, in which $0<x<3$, and x is a real number, such that when the dielectric layer includes $SrTiO_3$, the seed layer includes $SrTiO_{3-x}$, when the dielectric layer includes $BaTiO_3$, the seed layer includes $BaTiO_{3-x}$, and when the dielectric layer includes $CaTiO_3$, the seed layer includes $CaTiO_{3-x}$,
   the $SrTiO_3$, $BaTiO_3$, or $CaTiO_3$ of the dielectric layer directly contacts the $SrTiO_{3-x}$, $BaTiO_{3-x}$, or $CaTiO_{3-x}$ of the seed layer,
   the seed layer does not have a Perovskite structure, and
   the dielectric layer has a Perovskite structure.

8. The capacitor structure as claimed in claim 7, wherein the lower electrode includes $SrRuO_3$, $SrMoO_3$, $SrCoO_3$, $SrIrO_3$, $BaRuO_3$, $BaMoO_3$, $BaCoO_3$, $BaIrO_3$, $CaRuO_3$, $CaMoO_3$, $CaCoO_3$, or $CaIrO_3$.

9. The capacitor structure as claimed in claim 7, wherein a concentration of oxygen at a central portion of the lower electrode is greater than a concentration of oxygen at a portion thereof that is distal to the substrate and is greater than a concentration of oxygen at a portion thereof that is proximate to the substrate.

10. The capacitor structure as claimed in claim 7, wherein a concentration of oxygen at a portion of the lower electrode that is proximate to the substrate is greater than a concentration of oxygen at a portion of the lower electrode that is distal to the substrate.

* * * * *